United States Patent [19]

Nishizawa

[11] 3,809,953

[45] May 7, 1974

[54] METHOD OF AND DEVICE FOR CONTROLLING OPTICAL CONVERSION IN SEMICONDUCTOR

[75] Inventor: Jun-Ichi Nishizawa, Sendai, Japan

[73] Assignee: Semiconductor Research Foundation, Kawauchi, Japan

[22] Filed: May 1, 1972

[21] Appl. No.: 249,013

Related U.S. Application Data

[63] Continuation-in-part of Ser. No. 46,445, June 15, 1970, abandoned.

[30] Foreign Application Priority Data

June 18, 1969 Japan .............................. 44-48119

[52] U.S. Cl. .. 317/235 N, 317/235 R, 317/235 UA, 317/235 AQ

[51] Int. Cl. .......................................... H01l 15/00

[58] Field of Search ..... 317/235 N, 235 R, 234 UA, 317/235 AQ

[56] References Cited

UNITED STATES PATENTS 3,745,429 7/1973 Fryishira ........................ 317/235 R 3,502,884 3/1970 Perlman et al. .................... 250/211

3,176,151 3/1965 Atalla .................................. 307/88.5

3,417,248 12/1968 Hall ...................................... 250/211

3,415,996 12/1968 Grimmeirs .......................... 250/217

3,551,761 12/1970 Ruoff .................................. 317/235

3,488,636 1/1970 Dyck .................................... 340/173

*Primary Examiner*—Martin H. Edlow

*Attorney, Agent, or Firm*—Stevens, Davis, Miller & Mosher

[57] ABSTRACT

A method of and device for controlling optical conversion in which the electric charge distribution of a deep level impurity in the depletion layer of a semiconductor device is varied by directing light to the depletion layer or by injecting an elecric current in the depletion layer. As a result the width of the depletion layer and/or the electric field in the depletion layer are varied which lead to the variation in light transmission, photovoltaic power or photocurrent.

20 Claims, 13 Drawing Figures

METHOD OF AND DEVICE FOR CONTROLLING OPTICAL CONVERSION IN SEMICONDUCTOR

CROSS-REFERENCE TO RELATED APPLICATION

This is a continuation-in-part of application Ser. No. 46,445, filed on June 15, 1970, now abandoned.

BACKGROUND OF THE INVENTION

The present invention relates to an optical conversion control employing a semiconductor.

SUMMARY OF THE INVENTION

An object of the present invention is to provide a novel method of controlling optical conversion.

Another object of the present invention is to provide a novel semiconductor optical conversion control device.

According to one aspect of the present invention there is provided a method of controlling optical conversion by varying the width of the depletion layer of a pn junction formed in a semiconductor body, the pn junction containing therein an impurity which forms a deep energy level between the conduction band and the filled band of the semiconductor, comprising the step of applying a constant reverse bias voltage to said pn junction and simultaneously directing light to said pn junction to effect at least one of transmitting said light through said depletion layer, producing photovoltaic power across said pn junction and allowing a photocurrent to flow through said pn junction, and the step of then varying the electric charge distribution of said impurity so as to vary the width of said depletion layer, in the state in which said voltage and said light are respectively applied and directed to said pn junction, thereby controlling at least one of the transmission of said light through said depletion layer, photovoltaic power across said pn junction and photocurrent through said pn junction.

According to another aspect of the present invention there is provided a semiconductor optical conversion control device comprising a semiconductor body including therein a pn junction containing therein an impurity which forms a deep energy level between the conduction band and the filled band of the semiconductor, means for applying a constant reverse bias voltage to said pn junction, means for directing light to said pn junction, and means for varying the electric charge distribution of said impurity.

DESCRIPTION OF THE PREFERRED EMBODIMENTS

Figure 1A:
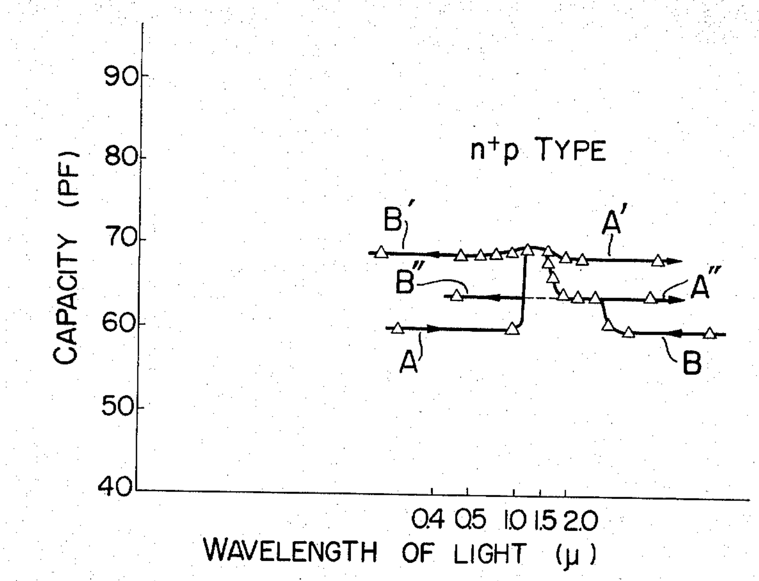
FIGS. 1*a* and 1*b* are graphs showing relations between the capacity of a depletion layer in gold doped silicon diodes and the wavelength of incident light at the liquid nitrogen temperature.

When an impurity in a semiconductor body is illuminated by light having a wavelength shorter than that $\lambda = c/\nu = ch/\Delta E$, where $c$ is the velocity of light, $\nu$ is the wave number and $h$ is the Planck's constant, determined by the energy $\Delta E$ sufficient to excite the electrons of the impurity into the conduction band, the electrons are excited into the conduction band to increase the electric charge of the impurity atom by one electronic charge in the positive direction. Of course, however, if there exist many electrons in the conduction band or if electrons in the filled band can easily be excited into the conduction band, the variation in the electric charge of the impurity is at once compensated for. As a result no effect is exhibited in the former case and only a slight photocurrent is produced in the latter case. In order to prevent the existence of many electrons in the conduction band a depletion layer is employed so that majority carriers may not exist. In order to prevent the electrons in the filled band from being excited into the conduction band, a semiconductor body doped with a deep-level-forming impurity is employed at a temperature not higher than the room temperature. The same situation holds for positive holes as for electrons.

Conventionally the term "deep impurity level" is often used to refer to a level nearer to the filled band than the center of the forbidden band. However, in fact it is effective only if a level is such that an electron at that level is hardly excited into the conduction band by thermal energy. From this point of view, the nearer to the filled band an energy level is, the more effective that level is.

The present invention employs a semiconductor body including therein a pn junction containing therein an impurity which forms a deep energy level between the conduction band and the filled band of the semiconductor. An example of an impurity forming such a deep energy level is gold in a p-type silicon or an n-type silicon.

A gold doped silicon diode, for example, is obtainable in the following manner.

First, gold is diffused into a p-type silicon of hole density of $10^{15}$–$10^{17}$ cm$^{-3}$ or an n-type silicon of electron density of $10^{15}$–$10^{17}$ cm$^{-3}$ so that a p-type silicon or an n-type silicon having a deep energy level of gold is obtained. The condition for the diffusion of gold can be determined by "Silicon Semiconductor Data" written by Helmut F. Wolf and published by Pergamon Press, especially Chapter 3, Sec. 3, "Diffusion characteristics of Gold." For example, gold is diffused at 1,100°C for 48 hrs. into a p-type silicon or an n-type silicon the thickness of which is about 500 $\mu$m. Then, AuSb or AuGa is alloyed to the p-type silicon or the n-type silicon to produce an $n^+p$ type diode or a $p^+n$ type diode respectively. In this case, a depletion layer is mainly in the p-type region in the $n^+p$ type diode and mainly in the n-type region in the $p^+n$ type diode. A gold doped silicon diode also may be constructed in such a manner that gold is added during the growth of a silicon crystal from a melt and a pn junction is then formed by means of alloying method or diffusion method, or in such a manner that gold is diffused after a pn junction is formed by means of alloying method or diffusion method. In any of the above-described cases a pn junction can be obtained containing therein a deep energy level and the obtained pn junction has no considerable difference in property due to the difference in the manufacturing method.

Figure 1B:
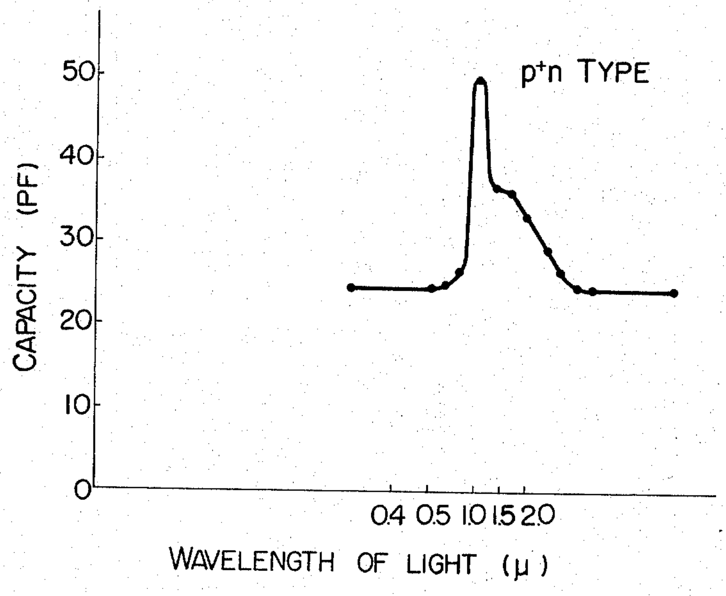
Figure 2:
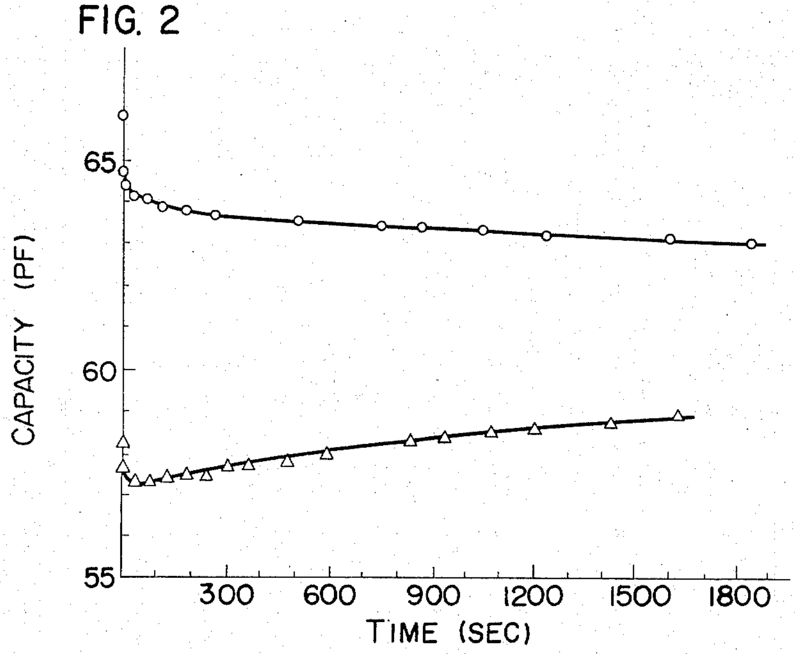
FIG. 2 is a graph showing variations in the capacity of the depletion layer with time at the liquid nitrogen temperature.

When a gold doped silicon diode thus obtained is exposed to light, the capacity of the depletion layer of the diode varies with the wavelength of the incident light as shown in FIGS. 1*a* and 1*b*, in which the curve of FIG. 1*a* is a result of measurements on an $n^+p$ type diode at the liquid nitrogen temperature with a reverse bias voltage of 5 volts applied thereto and the curve of FIG. 1*b* is a result of measurements on a $p^+n$ type diode at the liquid nitrogen temperature with no bias voltage. The curves of FIG. 2 show variations in the capacity of the depletion layer with time at the liquid nitrogen temperature, in which the upper curve is a result of measurements on an $n^+p$ type diode with a reverse bias voltage of 5 volts applied thereto illuminated by light of a wavelength of 1.4 microns and the lower curve is a result of measurements on an $n^+p$ type diode with a reverse bias voltage of 5 volts applied thereto illuminated by light of a wave-length of 2.5 microns. As seen in FIGS. 1*a* and 1*b*, the capacity of the depletion layer varies abruptly and markedly at wavelengths in the vicinity of about 2 microns. This capacity has a maximum at a certain intensity of the incident light and does not increase beyond this level even if the incident light having the certain intensity is maintained for a prolonged period. As shown in FIG. 2, the capacity of the depletion layer of the $n^+p$ type diode also does not substantially vary at the liquid nitrogen temperature for several hours after the interruption of the incidence of light. In other words, the capacity is memorized at the liquid nitrogen temperature. In order to extinguish this storage effect, a forward bias voltage may be applied to the diode, or, in some cases, photons having an energy equal to or larger than the width of the forbidden band or photons having an energy necessary to restore the charge of the deep-level-forming impurity atom may be directed to the diode at elevated temperatures relative to the liquid nitrogen temperature. Diodes having no storage action are used, in applications, in the illuminated state.

Referring again to FIG. 1*a*, when the wavelength of incident light is continuously increased, the capacity of the depletion layer varies along the curve A–A′, that is, at about 1.0 micron the capacity abruptly increases, and after reaching a maximum value, it does not substantially vary even if the wavelength is increased. This state is maintained for a considerable time due to the storage effect as depicted in FIG. 2. After the lapse of 2 days, the capacity drops from the curve A′ to the curve B. Then, if the wavelength is continuously decreased, the capacity varies along the curve B–B′. When the wavelength of incident light is discontinuously varied, that is, the range of the wavelength represented by the dotted line (in FIG. 1*a* between approximately 1.0 and 2.0 microns) is interrupted, the capacity varies along the curve A–A″ or B–B″.

Gold in p-type silicon has further important properties. Gold has two states corresponding to negative monovalence and negative divalence which can, in use, be differentiated in the wavelength of incident light. Thus, gold in p-type silicon can provide dual switching action with respect to wavelength.

The variation in the capacity of a depletion layer implies the variation in the width of and/or the intensity of electric field in the depletion layer. For the purpose of varying the capacity of the depletion layer, minority carriers may be produced by injection or optical excitation and trapped in the depletion layer. The effect of the variation in the width of the depletion layer can be employed for reading light as a variation in the photocurrent or for varying light transmission. The effect of the variation in the intensity of electric field can be employed for the electro-optical effect.

For example, when light of a wavelength of 2 microns is directed to an $n^+p$ type silicon diode doped with gold, and simultaneously or subsequently light having a wavelength of about 1 micron is directed thereto, the photocurrent decreases to about one half in comparison with the photocurrent flowing when the diode is not illuminated by the light having a wavelength of about 1 micron, because it is understood from FIG. 1*a* that the width of the depletion layer is reduced by the illumination of the light having a wavelength of about 1 micron. On the other hand, since the light transmitted through the diode is proportional to the width of the depletion layer, the intensity of the transmitted light decreases to about one half to one third. A similar situation holds for gallium arsenide doped with manganese or molybdenum and gallium phosphide doped with manganese or iron. As a semiconductor body one of the mixed crystals made from III–V compounds can also be used. As one of the electro-optical effect the Faraday effect can also be employed. The Faraday effect refers to the phenomenon in which optical axes of a material vary with the application of a magnetic field or an electric field to the material. In the present invention the intensity of electric field in the depletion layer varies with the application of the illumination of the light. Therefore, if the electric field of the depletion layer is applied to an optical material, the illumination of light induces the variation in optical axes which is based on the Faraday effect.

The sensitivity and response rate of the optical conversion according to the present invention are higher than the photochromism. The present invention has many applications, for example, devices according to the present invention provided with transparent electrodes can be employed for pattern recognition by being arranged in a matrix form.

Now referring to FIGS. 3 to 10, some embodiments constructed in accordance with the present invention will be described in detail.

Figure 3:
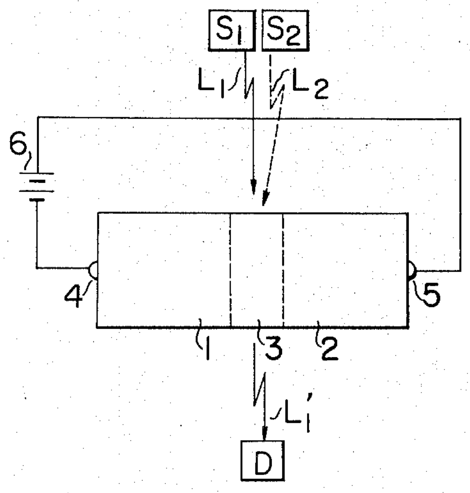
FIG. 3 is a circuit schematically showing an embodiment of a semiconductor optical conversion control device according to the present invention.
Figure 4A:
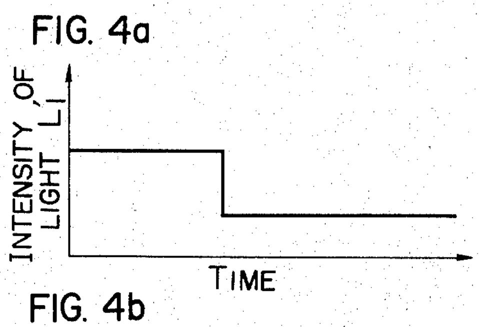
FIGS. 4*a* and 4*b* are graphs for explaining the embodiment of FIG. 3.
Figure 4B:
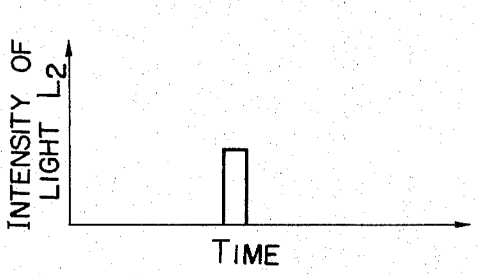

FIG. 3 shows a semiconductor optical conversion control device controlling light transmission by directing light to the depletion layer of a semiconductor body to vary the width of the depletion layer. An $n^+p$ type diode is provided with a junction between a p-type semiconductor 1 such as a p-type silicon doped with gold and an $n^+$-type semiconductor 2 such as an $n^+$-type silicon, so that a depletion layer 3 including therein gold as a deep-level-forming impurity is formed in the p-type region. A constant reverse voltage is applied from a constant d.c. voltage source 6 through electrodes 4 and 5 of the semiconductors 1 and 2 to the diode. When light $L_1$ is directed from a light source $S_1$ to the depletion layer 3, the light $L_1$ is partially reflected or absorbed by the diode and partially transmitted through the diode. The intensity of the transmitted light $L_1'$ is proportional to the width of the deplletion layer 3. The intensity of the transmitted light $L_1'$ is measured by a light detector D. But, if at this time another light $L_2$ of a wavelength corresponding to the deep impurity level is directed from a light source $S_2$ to the depletion layer 3, the intensity of the transmitted light $L_1'$ varies due to the variation in the width of the depletion layer 3. For example, if the light having a wavelength of 2 microns is employed as the light $L_2$, the intensity of the transmitted light $L_1'$ decreases due to the decrease of the width of the depletion layer 3 resulting from the increase of the capacity thereof. In this case, it will be understood from FIG. 1*a* that the decreasing amount of the intensity of the transmitted light $L_1'$ is about one half in comparison with that of the case when the light having a wavelength of 1 micron is employed as the light $L_2$. Since the variation in the width of the depletion layer 3 is maintained due to the storage effect even after the absence of the light $L_2$, the light $L_2$ can be of a pulse type. The relation between the lights $L_1'$ and $L_2$ is shown in FIGS. 4*a* and 4*b*. Further, as described previously such a storage effect can be extinguished by the application of a forward bias voltage to the diode.

Figure 5:
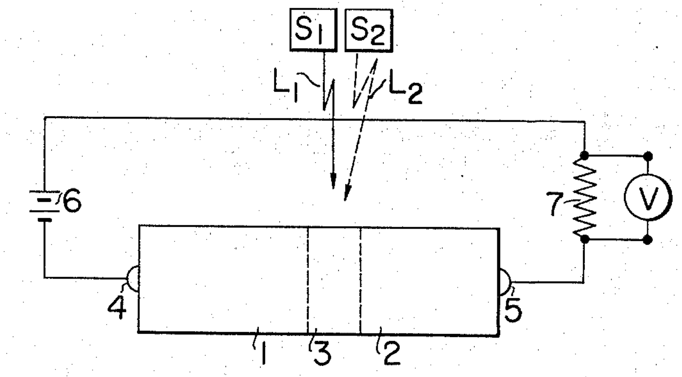
FIG. 5 is a circuit schematically showing another embodiment of a semiconductor optical conversion control device according to the present invention.
Figure 6A:
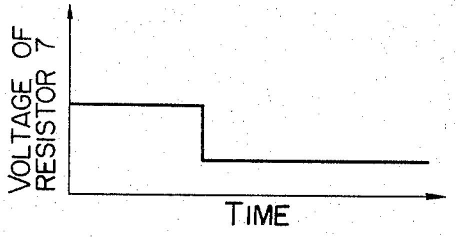
FIGS. 6*a* and 6*b* are graphs for explaining the embodiment of FIG. 5.
Figure 6B:
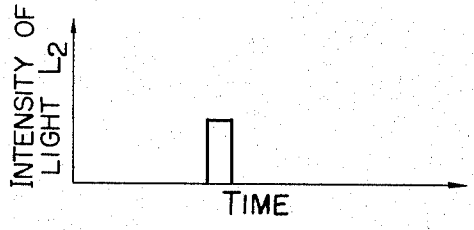
Figures 7, 8:
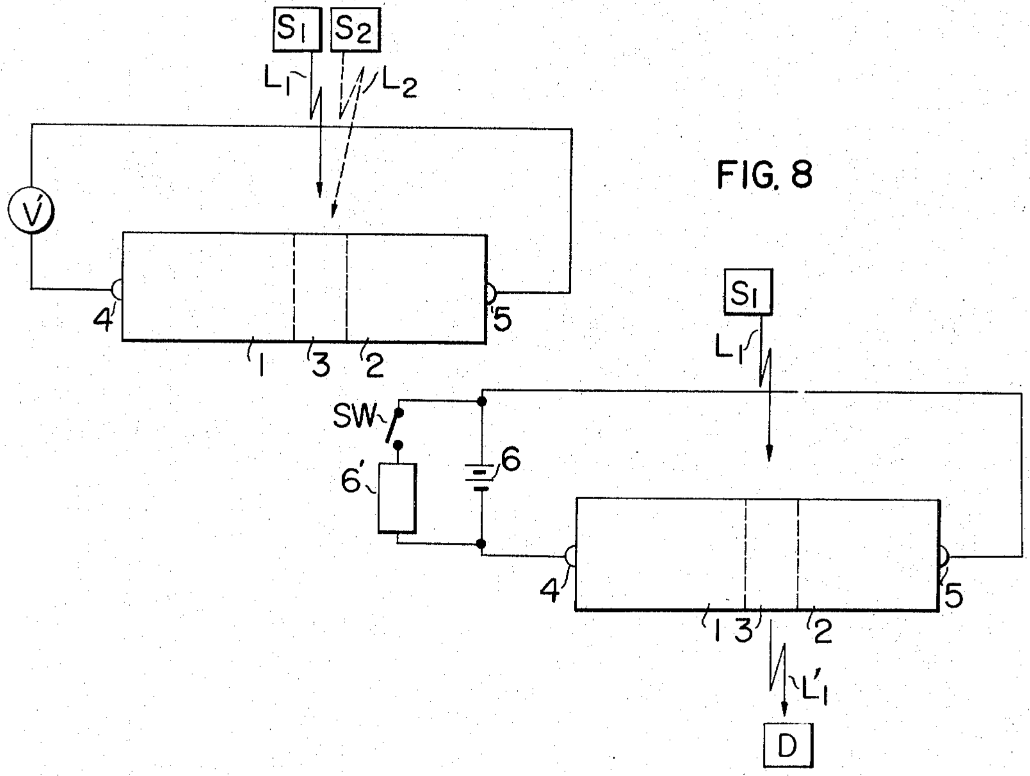
FIGS. 7 and 8 are circuits schematically showing another embodiments of a semiconductor optical conversion control device according to the present invention.

FIG. 5 shows a semiconductor optical conversion control device controlling photocurrent, in which a load resistor 7 is connected in series with the constant d.c. voltage source 6 and the same numerals as in FIG. 3 designate the same parts. When one light $L_1$ is directed from the light source $S_1$ to the depletion layer 3, a photocurrent flows through the circuit to cause a voltage drop to be produced across the resistor 7. This voltage drop across the resistor 7 is measured by a voltmeter V. If at this time another light $L_2$ of a wavelength corresponding to the deep impurity level is directed from the light source $S_2$ to the depletion layer 3, the photocurrent resulting from the light $L_1$ varies depending on the variation in the width of the depletion layer 3, to cause the voltage drop across the resistor 7 to vary. The relation between the voltage drop across the resistor 7 and the intensity of the light $L_2$ is shown in FIGS. 6*a* and 6*b*. Thus, the photocurrent flowing through the circuit can be controlled by the illumination of the light $L_2$ and the variation in the voltage drop can be obtained at the resistor 7. Also, it will be understood that the method of FIG. 5 can be embodied even in the case where the voltage source 6 is omitted and the omitted portion is shorted out or where a voltmeter V' having a high input impedance can be placed in the location of the voltage source 6 in order to measure the photovoltaic power between the electrodes 4 and 5, as shown in FIG. 7.

As described previously, the capacity of the depletion layer also may be varied by the injection of carriers. The injection of carriers can be carried out in such a manner that a forward bias voltage or a reverse bias voltage over the breakdown voltage of the diode is applied to the diode. FIG. 8 illustrates such a method. In the figure, a constant current source 6' which injects a forward bias voltage or a reverse bias voltage over the breakdown voltage is connected in parallel to the constant d.c. voltage source 6 through a switch SW. Normally, a constant reverse bias voltage under the breakdown voltage is applied to the diode by the voltage source 6. In order to inject an electric current to the diode, the constant current source 6' is connected to the diode by the switching action of the switch SW so that the capacity of the depletion layer 3 of the diode is varied.

Although in FIGS. 3, 5, 7 and 8 the pn junction was employed for the depletion layer, Schottky barrier, heterojunction and the like can be employed to obtain the same effect as the pn junction.

Figure 9:
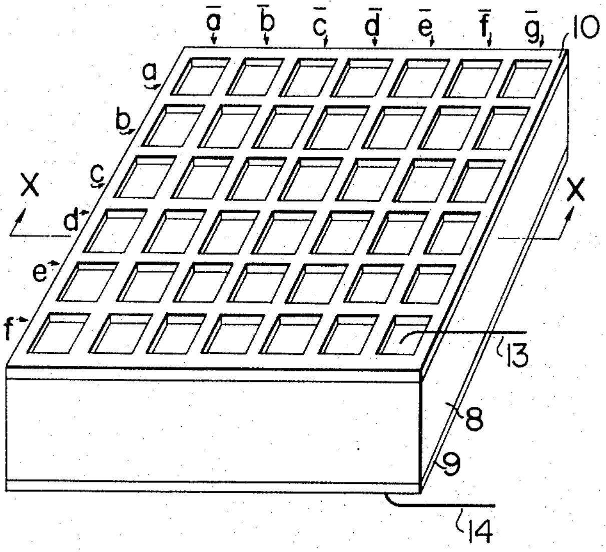
FIG. 9 is a perspective view showing an embodiment of a plurality of semiconductor optical conversion control devices according to the present invention arranged in a matrix form.
Figure 10:
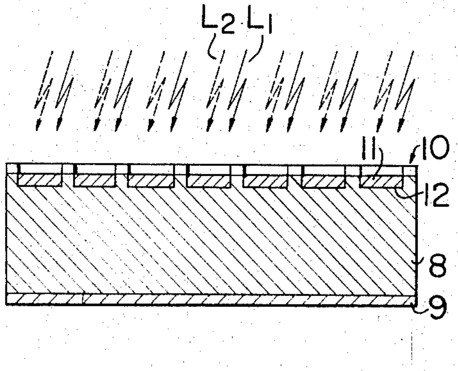
FIG. 10 is a cross section taken along the line X—X in FIG. 9.

FIG. 9 shows a schematic view of a simple example in which a plurality of devices according to the present invention are arranged in a matrix form and FIG. 10 shows the cross section taken along the line X—X in FIG. 9. An n-type (or p-type) semiconductor substrate 8 doped with a deep-level-forming impurity (for example, gold) is prepared. An impurity, for example, boron or phosphorus, of an opposite conductivity type to that of the substrate 8 is selectively diffused from one principal surface of the substrate 8 into the substrate 8 by means of a masking effect of an oxide film 10 of $SiO_2$ deposited selectively on the substrate 8, so that diffused layers 11 are formed. The diffused layers 11 can be formed by means of well-known methods employed generally for forming planar transistors or integrated circuits. Thus, a plurality of pn junctions 12 having therein deep impurity levels are formed. The depth of the diffused layers 11 is such that incident light can reach the pn junction 12. However, since light $L_2$ to be employed has an energy lower than that corresponding to the width of the forbidden band, it reaches the pn junctions 12 without being almost absorbed. In FIG. 9, thus, a diode matrix comprising $f \times \bar{g}$ diodes is constructed. A metal layer 9 is deposited on the bottom surface of the substrate 8. Further, lead wires are connected to the metal layer 9 and each diffused layer 11, respectively. The diodes of the thus constructed diode matrix are successively scanned so that the width of the depletion layer of each pn junction 12 is detected in the form of photovoltaic power or photocurrent. The scanning can be carried out by means of the lead wires. For example, when the lead wires 13 and 14 are employed for the detection, the width of the depletion layer of the diode positioned in a row f and a column $\bar{g}$ can be detected. The scanning of the diode matrix can also be effected by means of an electron beam.

I claim:

1. A method of controlling optical conversion by varying the width of the depletion layer of a pn junction formed in a semiconductor body, the pn junction containing therein an impurity which forms a deep energy level between the conduction band and the filled band of the semiconductor, comprising the steps of applying a constant reverse bias voltage to said pn junction and simultaneously directing light to said pn junction to effect at least one of transmitting said light through said depletion layer, producing photovoltaic power across said pn junction and allowing a photocurrent to flow through said pn junction, varying the electric charge distribution of said impurity so as to vary the width of said depletion layer, in the state in which said voltage and said light are respectively applied and directed to said pn junction, thereby changing at least one characteristic of said semiconductor body, including the transmission of said light through said depletion layer, photovoltaic power across said pn junction and photocurrent through said pn junction, and measuring said at least one changed characteristic.

2. A method of controlling optical conversion according to claim 1, in which the variation in the electric charge distribution is effected by directing to said pn junction another light of a wavelength corresponding to said deep energy level.

3. A method of controlling optical conversion according to claim 1, in which the variation in the electric charge distribution is effected by injecting an electric current in said pn junction.

4. A semiconductor optical conversion control device comprising:

a semiconductor body including therein a pn junction containing therein an impurity which forms a deep energy level between the conduction band and the filled band of the semiconductor, means for applying a constant reverse bias voltage to said pn junction, means for directing light to said pn junction, means for varying the electric charge distribution of said impurity so as to change at least one characteristic of said semiconductor body, including the transmission of said light through said pn junction, photovoltaic power across said pn junction and photocurrent through said pn junction, and means for measuring said at least one changed characteristic.

5. A semiconductor optical conversion control device according to claim 4, in which the means for varying the electric charge distribution is means for directing to said pn junction another light of a wavelength corresponding to said deep energy level.

6. A semiconductor optical conversion control device according to claim 4, in which the means for varying the electric charge distribution is means for injecting an electric current in said pn junction.

7. A semiconductor optical conversion control device according to claim 4, in which the semiconductor body is an $n^+p$ type silicon diode and the impurity is gold.

8. A semiconductor optical conversion control device according to claim 4, in which the semiconductor body is a $p^+n$ type silicon diode and the impurity is gold.

9. A semiconductor optical conversion control device according to claim 4, in which the semiconductor body is a gallium arsenide diode and the impurity is an element selected from the group consisting of manganese and molybdenum.

10. A semiconductor optical conversion control device according to claim 4, in which the semiconductor body is a gallium phosphide diode and the impurity is an element selected from the group consisting of manganese and iron.

11. A semiconductor optical conversion control device according to claim 4, in which the semiconductor body is one of the mixed crystals made from III–V compounds.

12. A semiconductor optical conversion control device according to claim 4, in which said means for measuring said at least one changed characteristic is means for detecting the changed transmission of said light through said pn junction.

13. A semiconductor optical conversion control device according to claim 4, in which said means for measuring said at least one changed characteristic is a voltmeter connected across a resistor which is connected between said semiconductor body and said means for applying the constant reverse bias voltage.

14. A semiconductor optical conversion control device according to claim 4, in which said means for measuring said at least one changed characteristic is a voltmeter connected across said semiconductor body.

15. A method of controlling optical conversion by the width of the depletion layer of a pn junction formed in a semiconductor body, the pn junction containing therein an impurity which forms a deep energy level between the conduction band and the filled band of the semiconductor, comprising the steps:

applying a constant reverse bias voltage to said pn junction and simultaneously directing light to said pn junction to transmit said light through said depletion layer, varying the electric charge distribution of said impurity so as to vary the width of said depletion layer, in the state in which said voltage and said light are respectively applied and directed to said pn junction, thereby changing the transmission of said light through said depletion layer, and detecting the changed transmission of said light through said depletion layer.

16. A method of controlling optical conversion by varying the width of the depletion layer of a pn junction formed in a semiconductor body, the pn junction containing therein an impurity which forms a deep energy level between the conduction band and the filled band of the semiconductor, comprising the steps of:

applying a constant reverse bias voltage to said pn junction and simultaneously directing light to said pn junction to produce photovoltaic power across said pn junction, varying the electric charge distribution of said impurity so as to vary the width of said depletion layer, in the state in which said voltage and said light are respectively applied and directed to said pn junction, thereby changing the photovoltaic power across said pn junction, and measuring the changed photovoltaic power across said pn junction.

17. A method of controlling optical conversion by varying the width of the depletion layer of a pn junction formed in a semiconductor body, the pn junction containing therein an impurity which forms a deep energy level between the conduction band and the filled band of the semiconductor, comprising the steps of:

applying a constant reverse bias voltage to said pn junction and simultaneously directing light to said pn junction to allow a photocurrent to flow through said pn junction, changing the electric charge distribution of said impurity so as to vary the width of said depletion layer, in the state in which said voltage and said light are respectively applied and directed to said pn junction, thereby changing the photocurrent through said pn junction, and measuring the changed photocurrent through said pn junction.

18. A semiconductor optical conversion control device comprising:

a semiconductor body including therein a pn junction containing therein an impurity which forms a deep energy level between the conduction band and the filled band of the semiconductor, means for applying a constant reverse bias voltage to said pn junction, means for directing light to said pn junction, means for varying the electric charge distribution of said impurity so as to change the transmission of said light through said pn junction, and means for detecting the changed transmission of said light through said pn junction.

19. A semiconductor optical conversion control device comprising:

a semiconductor body including therein a pn junction containing therein an impurity which forms a deep energy level between the conduction band and the filled band of the semiconductor, means for applying a constant reverse bias voltage to said pn junction, means for directing light to said pn junction, means for varying the electric charge distribution of said impurity so as to change photovoltaic power across said pn junction, and means for measuring the changed photovoltaic power across said pn junction.

20. A semiconductor optical conversion control device comprising:

a semiconductor body including therein a pn junction containing therein an impurity which forms a deep energy level between the conduction band and the filled band of the semiconductor, means for applying a constant reverse bias voltage to said pn junction, means for directing light to said pn junction, means for varying the electric charge distribution of said impurity so as to change photocurrent through said pn junction, and means for measuring the changed photocurrent through said pn junction.

* * * * *